United States Patent
Li et al.

(10) Patent No.: US 6,969,685 B1
(45) Date of Patent: Nov. 29, 2005

(54) ETCHING A DIELECTRIC LAYER IN AN INTEGRATED CIRCUIT STRUCTURE HAVING A METAL HARD MASK LAYER

(75) Inventors: SiYi Li, Fremont, CA (US); S. M. Reza Sadjadi, Saratoga, CA (US); Sean S. Kang, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 3 days.

(21) Appl. No.: 10/246,926

(22) Filed: Sep. 18, 2002

(51) Int. Cl.[7] .............................................. H01L 21/302
(52) U.S. Cl. ...................... 438/710; 438/712; 438/717; 438/720; 438/723
(58) Field of Search .............................. 438/710, 712, 438/717, 720, 723

(56) References Cited

U.S. PATENT DOCUMENTS

| | | | | |
|---|---|---|---|---|
| 6,162,587 A | * | 12/2000 | Yang et al. | 430/314 |
| 6,287,951 B1 | * | 9/2001 | Lucas et al. | 438/618 |
| 6,635,528 B2 | * | 10/2003 | Gilbert et al. | 438/253 |
| 6,734,096 B2 | * | 5/2004 | Dalton et al. | 438/624 |

* cited by examiner

Primary Examiner—Nadine G. Norton
Assistant Examiner—Binh X. Tran
(74) Attorney, Agent, or Firm—IP Strategy Group, PC

(57) ABSTRACT

The invention relates to the etching of a dielectric layer in an integrated circuit (IC) structure having a patterned metal hard mask layer. The method comprises feeding a gas mixture that includes a carbon monoxide (CO) and at least one fluorocarbon gas mixture into a reactor. The gas mixture has no oxygen ($O_2$) gas. The gas mixture is then converted into a plasma. The plasma selectively etches the dielectric layer. Typically, the dielectric layer comprises silicon.

34 Claims, 8 Drawing Sheets

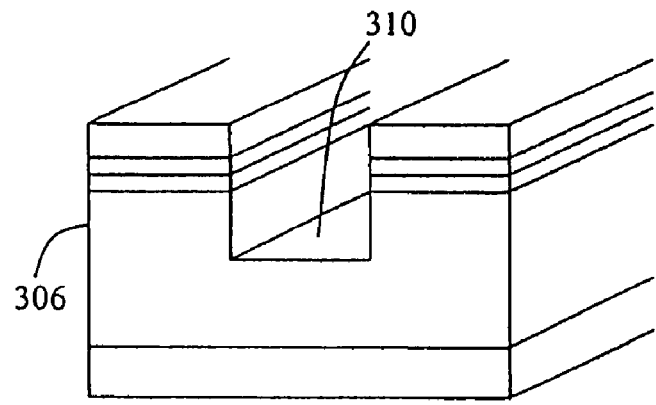
FIG. 5G(1)
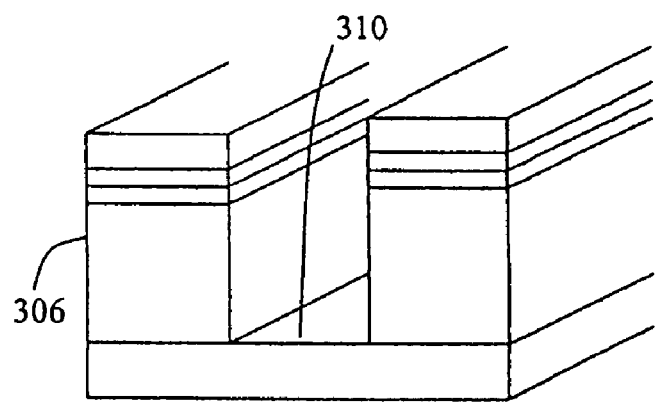
FIG. 5G(2)

ETCHING A DIELECTRIC LAYER IN AN INTEGRATED CIRCUIT STRUCTURE HAVING A METAL HARD MASK LAYER

BACKGROUND OF THE INVENTION

1. Field of Invention

The present invention relates to the etching of an integrated circuit structure. More particularly, the present invention provides a method for etching a dielectric layer with a metal hard mask layer.

2. Description of Related Art

Metallic compounds and their related metals, such as Tantalum Nitride and Tantalum or Titanium Nitride and Titanium, have been used in integrated circuit (IC) fabrication. Previously, the metals and/or the metallic compounds have been used as antireflective coatings or barrier layers.

However, as device critical dimensions (CD) continue to shrink and IC manufacturing technology enters 0.10 μm and beyond technology nodes, these metals and their associated metallic compounds are used as a metal hard mask layer for a dielectric layer. Typically the dielectric layer used for manufacturing technology that enters 0.10 μm and beyond technology nodes are referred to as "low-k dielectrics".

Low-k dielectrics can be categorized as follows: doped oxide, organic, highly fluorinated, and porous materials. Low-k materials can be deposited either by spin-on or CVD methods. Porous materials typically use spin-on methods, with controlled evaporation of the solvent providing the desired pore structure. A table of typical low-k dielectrics is provided below.

TABLE 1

Illustrative Low-k Dielectric Materials

| Film Types | Sub-Type | Examples | k range |
|---|---|---|---|
| Doped Oxide | F-doped | FSG | 3.5 |
|  | H-doped | HSQ | 2.7–3.5 |
|  | C (and H) doped | OSG, MSQ, CVD low-k | 2.6–2.8 |
| Organic |  | BCB, SiLK, FLARE, PAE-2 | 2.6–2.8 |
| Highly Fluorinated |  | Parylene AF4, a-CF, PTFE | 2.0–2.5 |
| Porous |  | Aerogels, Xerogels, Nanogels | <2.2 |

Low-k dielectric materials have dielectric constants of less than 4.0, and generally the dielectric constants are less than 3.0. Porous low-k dielectric materials having dielectric constants of less than 2.2 and are used in applications having CDs of 0.10 μm and beyond. The porous dielectrics have air trapped within the pore structure to generate low dielectric constants.

It was previously believed that the processes for etching porous low-k material would be the same as the processes used on the bulk materials. However, a variety of particular challenges related to the etching of an IC structure having a metal hard mask layer and a dielectric layer have been uncovered. These challenges include determining an etchant gas mixture that is selective to the dielectric layer and which provides little or no etching of the metal hard mask layer. Another challenge has been to provide a method for etching the dielectric layer and the metal hard mask layer in the same chamber, thereby improving the throughput.

Therefore it would be beneficial to provide an etchant gas mixture that is selective to the dielectric layer.

Additionally, it would be beneficial to provide an etchant gas mixture that performs little or no etching of said metal hard mask layer during the etching of the dielectric layer.

Further still it would be beneficial to provide a method for etching the dielectric layer and the metal hard mask layer in the same chamber.

SUMMARY OF THE INVENTION

The invention relates to the etching of a dielectric layer in an integrated circuit (IC) structure having a patterned metal hard mask layer. The method comprises feeding a gas mixture that includes a carbon monoxide (CO) and at least one fluorocarbon gas. The gas mixture has no oxygen ($O_2$) gas. The gas mixture is then converted into a plasma that selectively etches the dielectric layer. The plasma performs little or no metal hard mask etching.

The metal hard mask layer includes any metal compound. By way of example and not of limitation, a metal compound includes Tantalum Nitride (TaN) or Titanium Nitride (TiN) or any other such metal compound. Additionally, a metal compound includes any compound that comprises the metals Tantalum or Titanium.

The dielectric layer for the IC structure includes any silicon containing dielectric. The method provides for the partial etching of the dielectric and generates a smooth etch front in the partially etched dielectric layer. Alternatively, the method provides for the entire dielectric layer to be etched away.

BRIEF DESCRIPTION OF THE DRAWINGS

Preferred embodiments of the present invention are shown in the accompanying drawings wherein:

FIG. 5A through FIG. 5G shows an isometric view of a trench being etched according to the method of FIG. 4.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

The present invention is related to the etching of dielectric materials. It shall be appreciated by those of ordinary skill in the art that the invention can be applied to "0.10 μm and beyond" features sizes which include 0.07 μm feature sizes and any other feature size which is less than 0.10 μm. This description teaches a method for etching of a dielectric having a metal hard mask layer. The resulting interconnect structure having a via opening and a trench opening are also described.

Figure 1:
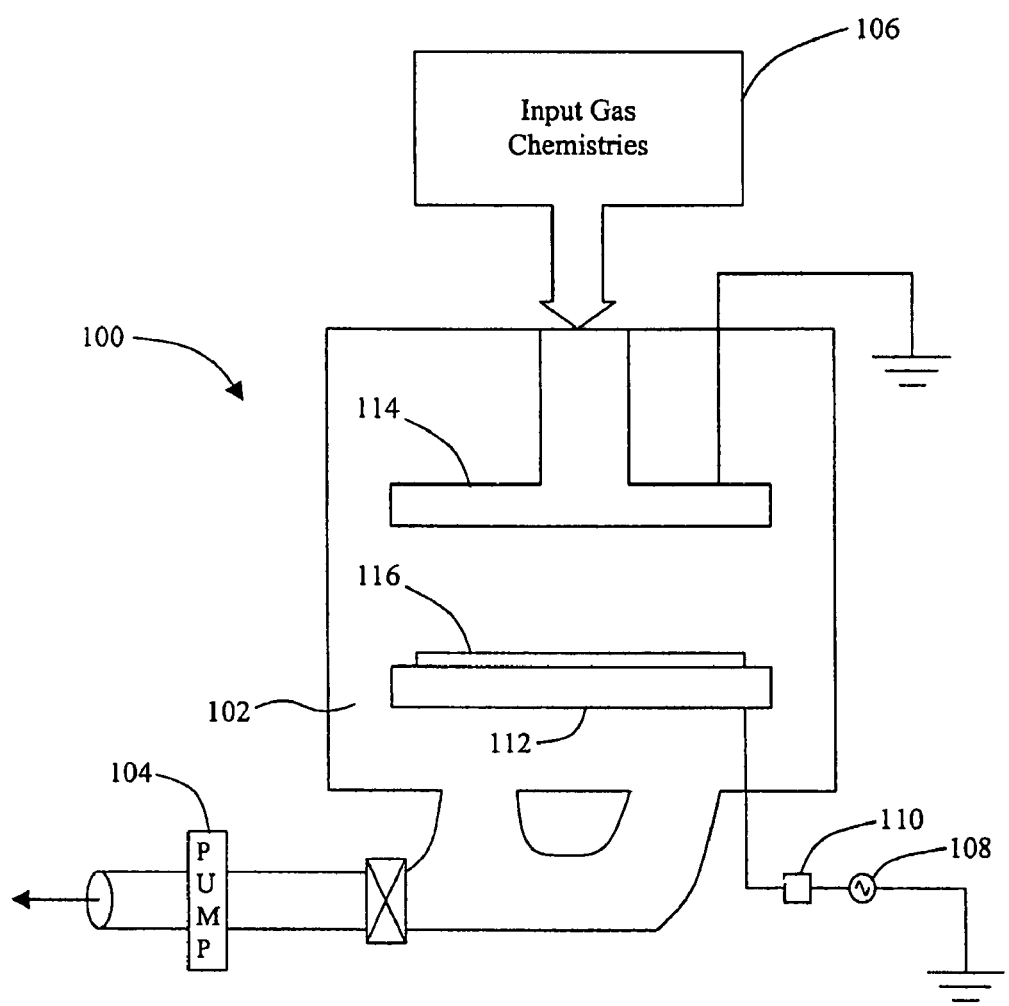
FIG. 1 shows a schematic representation of a medium density parallel plate plasma reactor which can be used to carry out the process of the invention.

Referring to FIG. 1, there is shown an illustrative system for performing the metal hard mask etching and the dielectric etching described hereinafter. The illustrative system of FIG. 1 permits performing both the metal hard mask etching and the dielectric etching in the same chamber. The illustrative system is a parallel plate plasma reactor such as reactor 100. The reactor 100 includes a chamber having an interior 102 maintained at a desired vacuum pressure by a vacuum pump 104 connected to an outlet in a wall of the reactor. An etchant gas mixture can be supplied to the plasma reactor with gas supply 106. A medium density plasma can be generated in the reactor by a dual frequency arrangement wherein RF energy from RF source 108 is supplied through a matching network 110 to a powered electrode 112. The RF source 108 is configured to supply RF power at 27 MHz and 2 MHz. Electrode 114 is a grounded electrode. A substrate 116 is supported by the powered electrode 112 and is etched with plasma generated by energizing the etch gasses into a plasma state. Other capacitively coupled reactors can also be used such as reactors wherein RF power is supplied to both electrodes such as the dual frequency plasma etch reactor described in commonly owned U.S. Pat. No. 6,090,304, the disclosure of which is hereby incorporated by reference.

Alternatively, the plasma can be produced in various other types of plasma reactors referred to as inductively coupled plasma reactor, an electron-cyclotron resonance (ECR) plasma reactor, a helicon plasma reactor, or the like. Such plasma reactors typically have energy sources which use RF energy, microwave energy, magnetic fields, etc. to produce a medium to high density plasma. For instance, a high density plasma could be produced in a transformer coupled plasma (TCP™) etch reactor available from Lam Research Corporation which is also called an inductively coupled plasma reactor.

Figure 2:
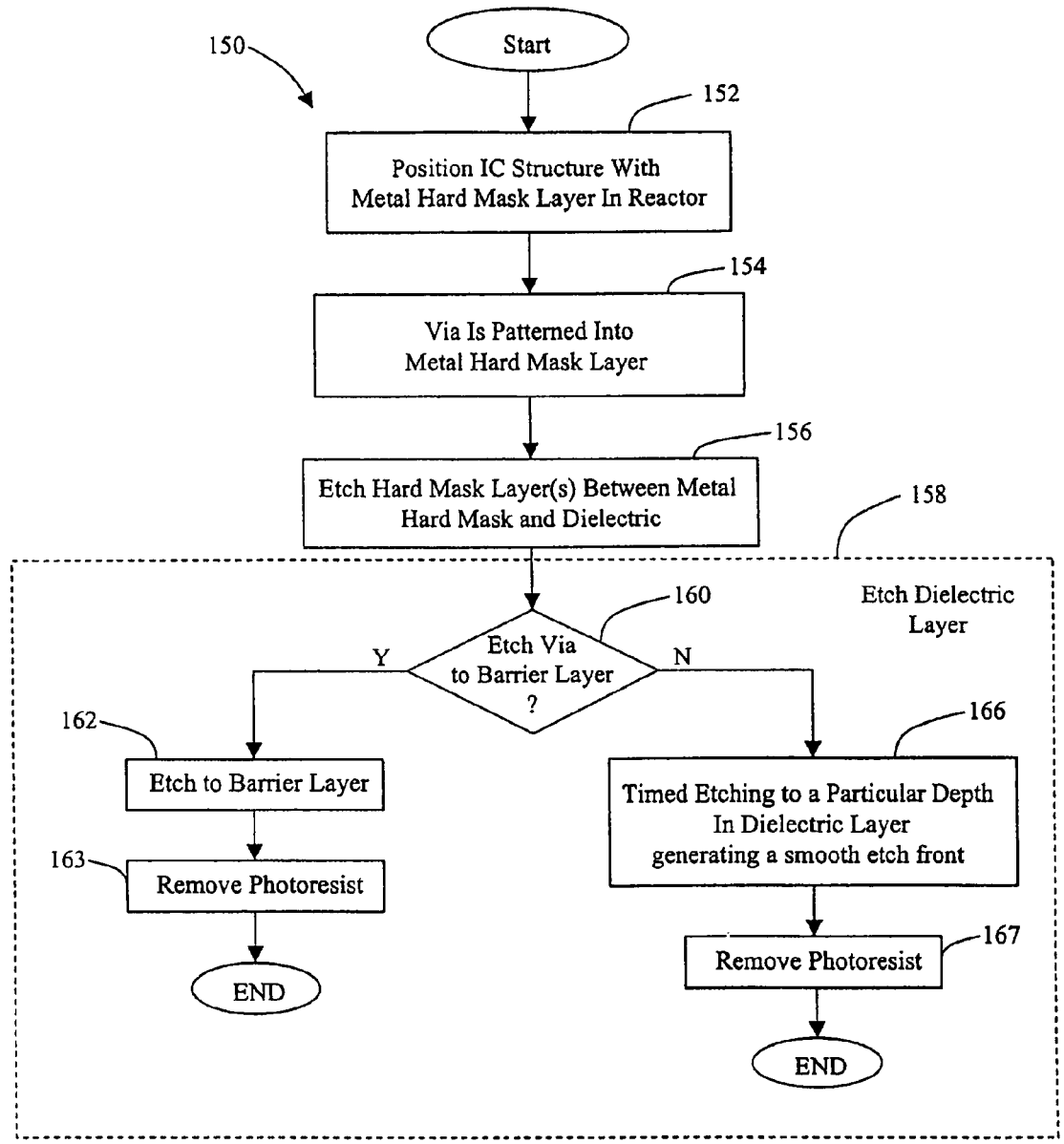
FIG. 2 shows a flowchart of a method for etching a via in an IC structure including a metal hard mask layer and a dielectric layer.
Figure 4:
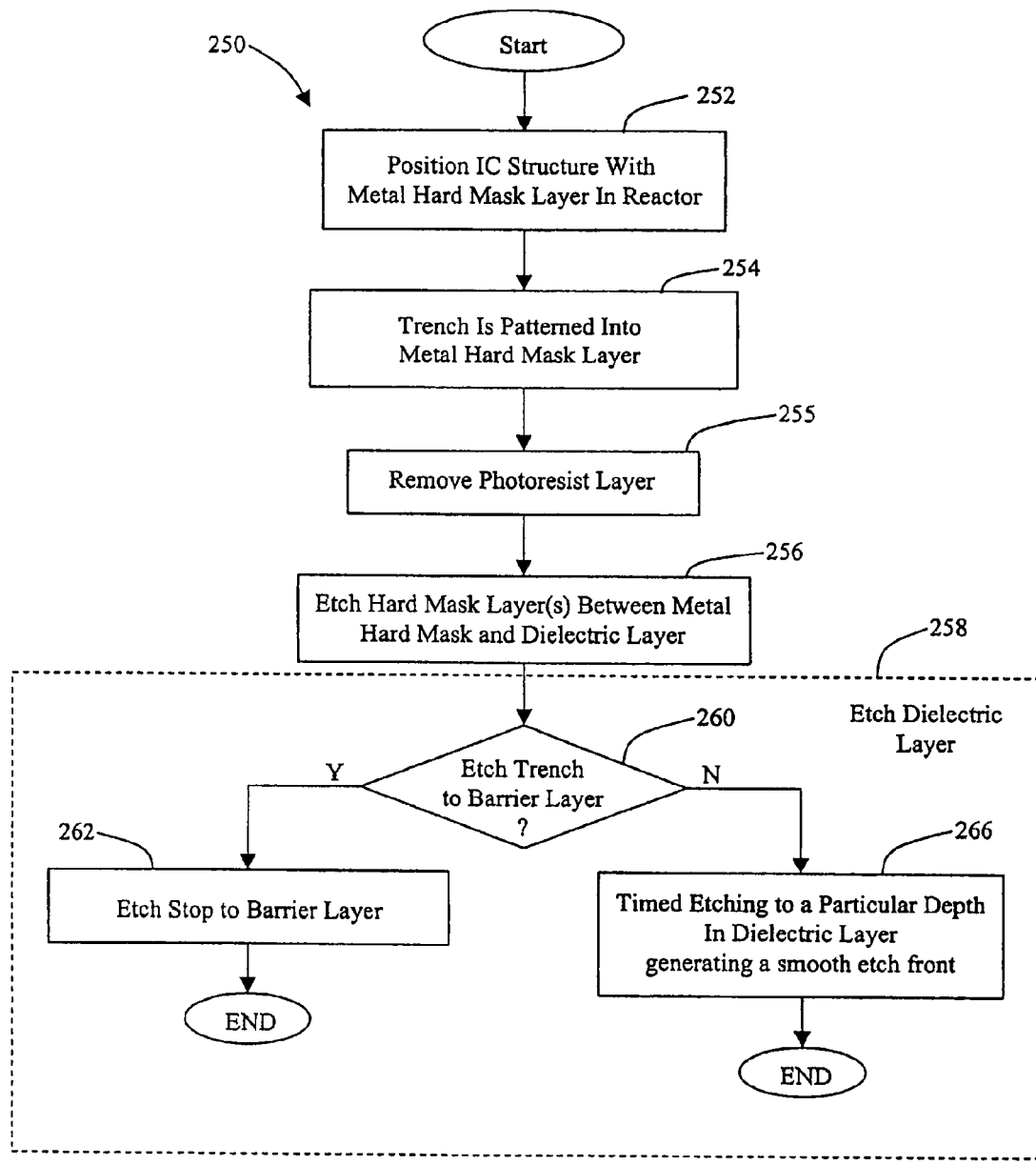
FIG. 4 shows a flowchart of a method for etching a trench in an IC structure including a metal hard mask layer and a dielectric layer.

Referring to FIG. 2 and FIG. 4 there is shown a method for etching a via and a trench, respectively. Each of these methods is applied to an IC structure that includes a metal hard mask layer and a dielectric layer. In one embodiment, the methods of the present invention are applied to an IC structure having a patterned photoresist or "resist" layer, a metal hard mask layer preferably, a first intermediate hard mask layer, a second intermediate hard mask layer, a dielectric layer, and a barrier layer.

In general, the metal hard mask layer comprises a metal or a metallic compound. The metallic compound includes either Tantalum Nitride (TaN) or Titanium Nitride (TiN) or any other such metallic compound. Additionally, other metallic compounds that include Tantalum and Titanium can also be used as the metal hard mask layer. Furthermore, it shall be appreciated by those of ordinary skill in the art that other metals or metallic compounds can be used for the metal hard mask layer.

In general, the dielectric materials etched by the method described herein comprise silicon. In one embodiment, the dielectric materials etched by the method described herein are low-k dielectric materials as described above in Table 1. In another embodiment, the dielectric material includes silicon oxide (SiO). In yet another embodiment, the dielectric material can include an organic compound and silicon such as organo-silica-glass (OSG). In a further embodiment, the dielectric material can include an inorganic compound and silicon. In still a further embodiment, the dielectric material include a "porous" low-k dielectric that is either organic or inorganic.

In an illustrative embodiment that is described in further detail below, the metal hard mask layer is Tantalum Nitride. Adjacent the metal hard mask layer is the first intermediate mask layer that comprises either Silicon Nitride (SiN) or Silicon Oxide (SiO). The second intermediate hard mask layer is Silicon Carbide (SiC). One of the purposes of the first and second intermediate hard mask layers is to provide adhesion between the metal hard mask layer and the dielectric layer.

The remaining layers in the illustrative IC structure include the silicon dielectric layer and the barrier layer. As previously mentioned, the dielectric layer comprises silicon. In the illustrative embodiment, the dielectric layer is a porous low-k dielectric layer which is a hybrid organic/inorganic silicate film having a porosity in which the void space is greater than 30% such as a porous organo-silica-glass (pOSG) film. The barrier layer material can be composed of either Silicon Carbide (SiC) or Silicon Nitride (SiN).

Referring back to FIG. 2 there is shown a flowchart describing the method for performing a via etch in a metal hard mask layer. The method is initiated at process block 152 in which the IC structure having a metal hard mask layer is positioned in reactor such as reactor 100. The method then proceeds to process step 154 in which a via is patterned into the metal hard mask layer. The generation of a via patterned hardmask layer presumes the step of completing the photolithography on the photoresist or "resist" layer. As is well known in the art, photolithography uses a light sensitive photoresist that is baked and exposed to a controlled light source. The light passes through a reticle that communicates the desired pattern.

At process block 154 the first metal hard mask layer is etched. During this step, the patterned resist layer is not attacked significantly by the etchant gas mixture. In one illustrative embodiment, the metal hard mask layer comprises TaN. During the dry etching process conducted in reactor 100, the TaN hard mask layer is removed by generating a volatile Tantalum by-product such as tantalum oxide ($Ta_2O_5$) or tantalum fluoride ($TaF_5$) or a combination thereof. The volatile Tantalum by-product reduces any potential micromasking of the photoresist layer.

The etchant gas mixture which generates the volatile Tantalum by-product(s) includes either oxygen ($O_2$) gas, or fluorine ($F_2$) gas, or a fluorine-containing gas, such as $NF_3$ or $CF_4$ or $CHF_3$, or a combination thereof. It shall be appreciated by those skilled in the art that other halogen gases such as chlorine ($Cl_2$), bromine ($I_2$), and iodine ($I_2$) can also be used to generate volatile tantalum halides. Typically, the fluorocarbon gas has a chemical composition of $C_xF_y$, or $C_xF_yH_z$, wherein x,y and z represent integers. Further still, the etchant gas mixture may include an inert gas as a diluent. The inert gas includes the nobles gases Ar, He, Ne, Kr, and Xe.

The method then proceeds to process block 156 where the first intermediate hard mask layer and the second intermediate hard mask layer is etched. In the illustrative embodiment the first intermediate hard mask layer is composed of Silicon Nitride (SiN) and the second intermediate hard mask layer is composed of Silicon Carbide (SiC). As described above, the purposes of both the first intermediate hard mask layer and the second intermediate hard mask layer is to provide adhesion between the metal hard mask layer and the dielectric layer, and to provide a method to avoid having any oxygen ($O_2$) in the reactor 100 prior to etching the dielectric layer. Preferably, the etching of the hard mask layers is performed in the same reactor 100.

In the illustrative embodiment the first intermediate hard mask layer is composed of either SiN and is etched with a fluorocarbon mixture that includes oxygen ($O_2$). One illustrative gas mixture for etching the first intermediate hard mask layer includes $CF_4$ or $CHF_3$ and oxygen ($O_2$) gas. Another alternative illustrative gas mixture includes $NF_3$, $CH_3F$, and oxygen ($O_2$) gas.

The second intermediate hard mask layer is composed of SiC and is etched with a fluorocarbon mixture that does NOT include oxygen ($O_2$) gas. An illustrative gas mixture for etching the second intermediate hard mask layer includes $CF_4$ and nitrogen ($N_2$) gas, or $CHF_3$ and nitrogen ($N_2$) gas, or any combination thereof. An illustrative gas mixture for the etching of the second intermediate hard mask layer includes 200 sccm of nitrogen ($N_2$) gas, 10 sccm of $CF_4$, 10 sccm of $CHF_3$ gas, and 200 sccm of Argon gas. The illustrative RF power is 800 Watts, and the resulting SiC (third hard mask layer) etch rate is 900 Å/min and the SiN (second hard mask layer) is 500 Å/min.

After the hard mask layers have been etched, the method proceeds to the etching of the dielectric material. The boundary condition 158 defines the process steps for the etching of the dielectric layer. It shall be appreciated by those skilled in the art having the benefit of this disclosure that the process steps described within boundary 158 are not limited to an IC structure having a Tantalum Nitride metal hard mask layer, and the method can be applied to any IC structure having a metal hard mask layer.

At decision diamond 160 the decision is made regarding the depth of etching into the dielectric layer. More particularly, the decision must be made whether to perform a partial etch into the dielectric layer or whether to etch through the dielectric layer to the barrier layer.

In general the dielectric layer is etched with an additive gas mixture that include carbon monoxide (CO) and at least one fluorocarbon gas. The additive gas mixture can be applied to other fluorocarbon gases or non-fluorocarbon gases. By way of example, the fluorocarbon gases include $CF_4$, $CHF_3$, $CH_2F_2$, $C_2F_6$, $C_4F_8$, $C_4F_6$, and other such fluorocarbon gases. By way of example, the non-fluorocarbon gases included $NF_3$, $F_2$, and $H_2$. Additionally, the etchant gas mixture can include an inert gas as a diluent. The inert gas may be a noble gas such as Argon or any other such noble gas.

In the illustrative IC structure the dielectric layer is a porous low-k dielectric layer such as pOSG. If the decision at decision diamond 160 is made to etch the illustrative porous low-k dielectric layer all the way through to the barrier layer, then the method proceeds to process block 162. The etchant gas mixture that is selective to dielectric comprises carbon monoxide (CO) and at least one fluorocarbon gas. For the illustrative porous dielectric layer, the fluorocarbon gas includes $CF_4$, $CHF_3$, and any other such fluorocarbon gas as described above.

An illustrative example for etching of the illustrative porous low-k dielectric material is provided in Table 2. The etchant gas mixture includes CO, $C_4F_8$, $N_2$, and Ar at flow rates of 100 sccm, 5 sccm, 140 sccm, and 110 sccm, respectively. The operating parameters during the etching process include applying a chamber pressure of 135 mTorr and a RF power of 500 Watts. By way of example and not of limitation, the etching of the illustrative porous low-k dielectric is performed within the same chamber as the etching of the metal hard mask layer and the etching of the photoresist layer. As previously described the reactor 100 generates a medium density plasma during the etching process.

TABLE 2

Illustrative Gas Mixture For Etching Porous Low-K Dielectric to Barrier Layer

| Etchant | Supply Rate (sccm) | Chamber Pressure (mTorr) | RF Power (W) | TaN Etch Rate (Å/min) | POSG Etch Rate (Å/min) | SiN Etch Rate (Å/min) | SiC Etch Rate (Å/min) |
|---|---|---|---|---|---|---|---|
| CO | 100 | 135 | 500 | 0 | 3400 | 210 | 150 |
| $C_4F_8$ | 5 | | | | | | |
| $N_2$ | 140 | | | | | | |
| Ar | 110 | | | | | | |

The etch rates in Table 2 are calculated for a plurality of blanket wafers. The resulting etch rate for the TaN hardmask layer is zero. The resulting etch rate for the illustrative porous low-k dielectric layer, i.e. pOSG, is 3400 Å/min. The etch rate for a SiN barrier layer is 210 Å/min, and the etch rate for a SiC barrier layer is 150 Å/min. The actual etch rate for a patterned wafer is dependent on the type and thickness of the various hard mask layers, so the blanket wafer data is provided instead. In certain instances the actual etch rate for a patterned wafer may be two times higher than the etch rate for the blanket wafers.

If the decision is made to perform a partial etch in the porous low-k dielectric layer, then the method proceeds to process block 166. At process block 166 the time interval for performing the partial etch determines the depth of the partial etch. Thus, the longer the IC structure is exposed to the etchant gas mixture in Table 2, the deeper the etch depth in the porous low-k dielectric layer.

During the partial etching of a porous low-k dielectric, it is desirable to generate a smooth etch front within the porous low-k dielectric layer. The smooth etch front provides an etched dielectric surface that lacks the roughness associated with the porous low-k dielectric materials. An illustrative example of an etchant gas mixture that generates a smooth etch front during the partial etching of the porous low-k dielectric has already been shown above in Table 2. The illustrative etchant gas mixture that generates the smooth etch front includes carbon monoxide (CO) and at least one fluorocarbon gas. The actual mechanism for generating the smooth etch front is not known, however, the use of CO has been found to be critical to the formation of the smooth etch front. The interval of time needed to perform the partial etching is dependent on a variety of variables such as the depth of the hardmask layer, the type of dielectric, the desired depth of the partial etch, and other such parameters. Thus, it shall be appreciated by those skilled in the art that the actual operating parameters for the partial etching of the porous low-k dielectric will vary.

After the dielectric layer is either etched to the barrier layer or partially etched, the method proceeds to removing the photoresist as described by process block 163 or process block 167. The prior art teaches photoresist removal using an oxidizing agent such as oxygen ($O_2$) or a halide gas. However, the use of such oxidizing agents would result in the removal of the hard mask layer, therefore an etchant gas mixture that is selective to the photoresist layer is needed.

One of the principal gases in the etchant mixture for photoresist removal includes a highly fluorinated fluorocarbon gas such as $CF_4$ or $CHF_3$. The highly fluorinated fluorocarbon gas is used to remove any residue or micromask that may have been deposited on the photoresist layer during the etching of the metal hard mask layer. An illustrative gas mixture for removing the photoresist layer is includes nitrogen ($N_2$), a fluorocarbon gas such as $CF_4$, nitrogen trifluoride ($NF_3$), and hydrogen ($H_2$) gas supplied at flow rates of 600 sccm, 15 sccm, 15 sccm, and 500 sccm, respectively. The chamber pressure is 280 mTorr and the RF power is 600 Watts during the process step 156 of etching the first photoresist layer. There is no identifiable etching of the illustrative TaN hard mask layer during the etching of the photoresist layer. According to the illustrative embodiment, the hard mask layers and the photoresist can be etched in the same reactor 100, thereby expediting wafer processing.

It shall be appreciated by those skilled in the art that the optimal flow rates and ratios for the illustrative gas mixture may change depending on the type of plasma etch chamber, the substrate size, and other such variables that are well known to those skilled in the art. Furthermore, it shall also be appreciated by those of ordinary skill in the art that the selection of temperatures, power level, and gas pressures used in practicing the present invention can vary widely and that those specified herein are give by way of example, and not as a limitation for the scope of the invention.

Referring to FIG. 3A through FIG. 3I there is shown an isometric view of a via being etched according to the method described above. It shall be appreciated by those skilled in the art that the illustrative via is filled with either aluminum or copper interconnects or any such conductive material. In the illustrative embodiment, the IC structure includes a photoresist layer 202, a metal hard mask layer 203 of TaN having a thickness of approximately 15 to 50 nm, a first intermediate hard mask layer 204 of SiN, a second intermediate hard mask layer 205 of SiC, a porous low-k dielectric layer 206 of pOSG having a thickness of approximately 200 to 1000 nm; and a barrier layer 208 having a thickness of around 45 to 70 nm.

Figure 3A:
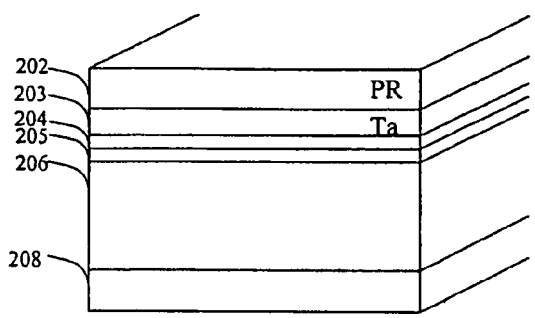
FIG. 3A through FIG. 3I shows an isometric view of a via being etched according to the method of FIG. 2.
Figure 3B:
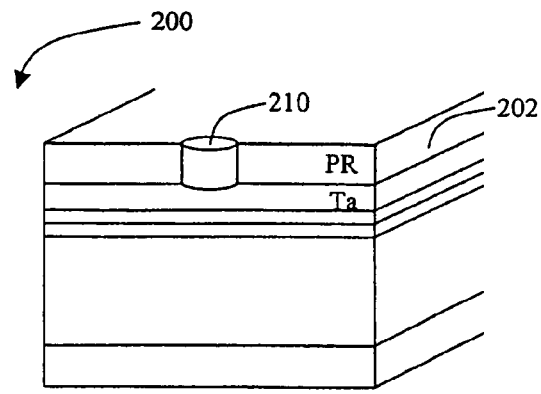
Figure 3C:
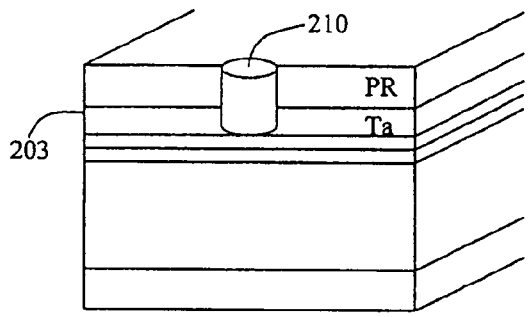

Referring to FIG. 3B, there is shown a via 210 etched into the photoresist layer 202. The illustrative via has an internal diameter of less than 0.12 $\mu$m for a CD of 0.10 $\mu$m, and an internal diameter of less than 0.09 $\mu$m for a CD of 0.07 $\mu$m. After the via portion of the photoresist has been etched, the method proceeds to the etching of the TaN hard mask layer 203 as shown in FIG. 3C. As described in process block 154, during the etching of the TaN hard mask layer 203 a volatile metal by-product is generated. As previously described, the etchant gas includes either oxygen ($O_2$) or a halide gas mixed with a fluorocarbon gas and possibly a diluent gas such as Argon.

Figure 3D:
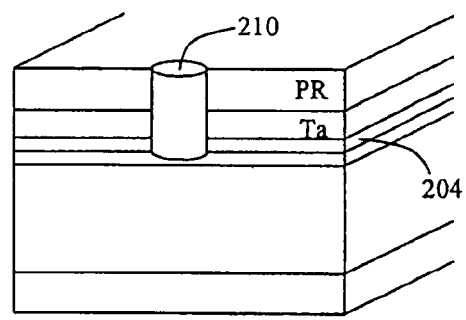
Figure 3E:
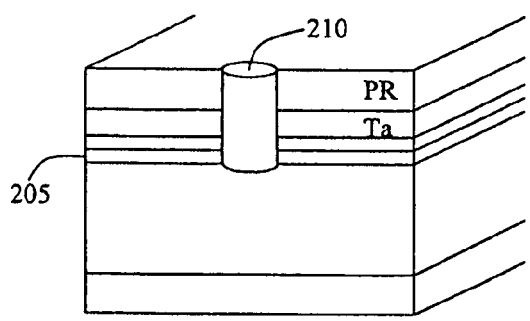

Referring to FIG. 3D, there is shown an integrated circuit structure after etching the first intermediate hard mask layer 204. In the illustrative embodiment the first intermediate hard mask layer 204 is SiN according to the process step 156. In FIG. 3E there is shown the illustrative integrated circuit structure after etching the second intermediate SiC hard mask layer 205. As previously described in process block 156, during the etching of the second intermediate SiC hard mask there is no oxygen ($O_2$) in the etchant gas mixture.

Figure 3F:
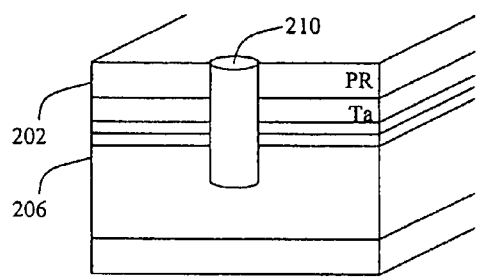
Figure 3G:
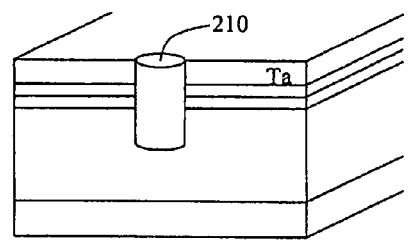

Referring to FIG. 3F, there is shown the integrated circuit structure after the partial etching of the via 210 into the porous low-k dielectric layer 206. The partial etching is performed using carbon monoxide and a fluorocarbon gas as described above in process step 166. The depth of the partial etch is controlled by the amount of time the etchant gas mixture is exposed to the IC structure. The photoresist layer is then etched according to the process block 167 and results in the IC structure shown in FIG. 3G.

Figure 3H:
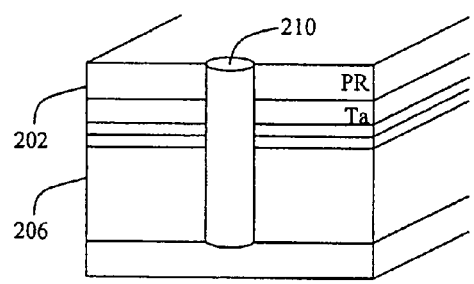
Figure 3I:
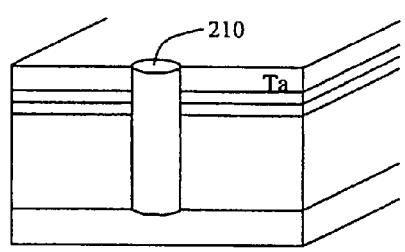

Alternatively, the via may be etched all the way through to porous low-k dielectric material 206 to the barrier layer 208 as shown in FIG. 3H. The via etch is performed using carbon monoxide and a fluorocarbon gas as described in process step 162 described above. The photoresist 202 is then etched according to process block 163 and the resulting IC structure is shown in FIG. 3I.

Referring to FIG. 4 there is shown a flowchart of a method for etching a trench in the IC structure described in FIG. 3. The trench process described in FIG. 4 can be applied by itself or in conjunction with the via process described in FIG. 2. By way of example and not of limitation, in a via-first dual damascene structure the via would be etched first and then the trench would be etched according to the method described below.

The trench etch method of FIG. 4 is initiated at process block 252 with a trench patterned on the metal hard mask layer. The generation of a trench on the patterned metal hard mask layer presumes the step of completing the photolithography on the first photoresist or "resist" layer as described above.

The method then proceeds to process block 254 in which the metal hard mask layer is etched. In the illustrative embodiment, the metal hard mask layer is composed on TaN. During the etching of the trench a volatile Tantalum by-product such as tantalum oxide ($Ta_2O_5$) or tantalum fluoride ($TaF_5$) or a combination thereof is generated. The etchant gas mixture is described in further detail in the process block 154 described above.

The method then proceeds to process block 255 where the photoresist layer is removed. The removal of the photoresist proceeds is performed in a manner consistent with process blocks 163 and 167 described above. The typical gas chemistry for the removal of the photoresist does not include oxygen ($O_2$) or a halogen gas. One of the principal gases in the etchant mixture for photoresist removal includes a highly fluorinated fluorocarbon gas such as $CF_4$ or $CHF_3$. The highly fluorinated fluorocarbon gas is used to remove any residue or micromask that may have been deposited on the photoresist layer during the etching of the metal hard mask layer.

The method then proceeds to process block 256 where the first intermediate hard mask layer and the second intermediate hard mask layer are etched. The process 256 proceeds in a manner similar to the process 156 described above. For the illustrative IC embodiment, the first intermediate hard mask layer is composed of Silicon Nitride (SiN), and the second intermediate hard mask layer is composed of Silicon Carbide (SiC). As described above in process 156, the second hard mask layer is etched with a gas mixture that includes oxygen (O$_2$) gas. However, the third hard mask layer is etched with a fluorocarbon mixture that does NOT include oxygen.

After the hard mask layers have been etched, the method proceeds to the etching of the dielectric material. The boundary condition 258 defines the process steps for the etching of the dielectric layer. The process steps within boundary condition 258 are substantially similar to the process steps in boundary condition 158 described above.

Within the boundary condition 258 is a decision diamond 260 that relates to the etching depth for the dielectric layer. More particularly, the decision must be made whether to partially etch a trench into the dielectric layer or whether to etch the trench through the dielectric layer to the barrier layer.

If the decision at decision diamond 260 is made to etch the illustrative porous low-k dielectric layer all the way through to the barrier layer, then the method proceeds to process block 262. Again the process block 262 mirrors the process block 162, with the only exception being that the photoresist layer has already been removed. The trench is etched into the illustrative porous low-k dielectric layer with a gas mixture that includes carbon monoxide (CO) gas and a fluorocarbon gas as described above. By way of example and not of limitation, the etching of the illustrative porous low-k dielectric can be performed within the same chamber 100 as the etching of each hard mask layer and the etching of the photoresist layer.

If the decision is made to perform a partial etch in the porous low-k dielectric layer, then the method proceeds to process block 266 in which the partial etch is determined by the time interval for performing the partial etch determines. Thus as described in process block 166, the longer the illustrative IC structure is exposed to the etchant gas mixture in Table 3, the deeper the etch depth in the porous low-k dielectric layer. During the partial etching of the porous low-k dielectric, a smooth etch front within the porous low-k dielectric layer is generated using the additive gas mixture described above.

Referring to FIG. 5A through FIG. 5G there is shown an isometric view of a trench being etched according to the method 250 described in FIG. 4. In the illustrative embodiment, the IC structure includes a photoresist layer 302, a TaN hard mask layer 303 having a thickness of approximately 15 to 50 nm, a first intermediate hard mask layer 304 of SiN, a second intermediate hard mask layer 305 of SiC, a porous low-k dielectric layer 306 of pOSG having a thickness of approximately 200 to 1000 nm; and a barrier layer 308 having a thickness of around 45 to 70 nm.

Figure 5A:
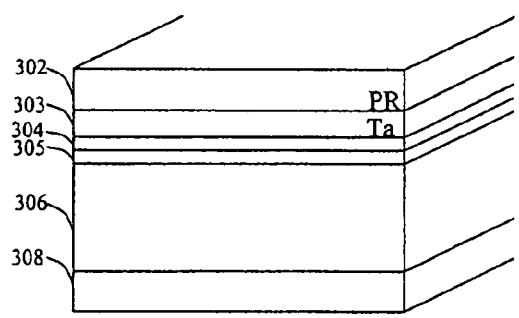
Figure 5B:
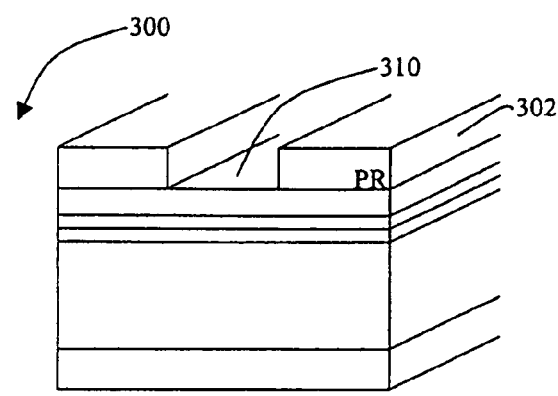
Figure 5C:
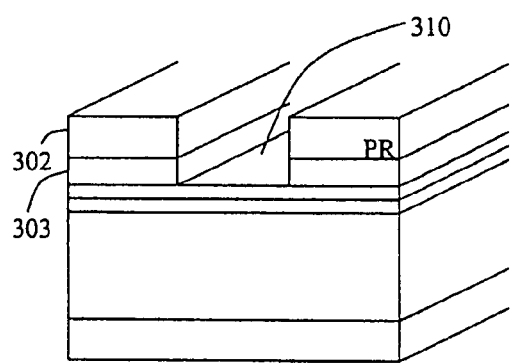

Referring to FIG. 5B, there is shown a trench 310 etched into the photoresist layer 302. The illustrative trench has an width of less than 0.12 $\mu$m for a CD of 0.10 $\mu$m, and a width of less than 0.09 $\mu$m for a CD of 0.071 $\mu$m. After the trench portion of the photoresist has been etched, the method proceeds to the etching of the TaN hard mask layer 303 as shown in FIG. 5C. As described in process block 254, during the etching of the TaN hard mask layer 303 a volatile metal by-product is generated. As previously described, the etchant gas includes either oxygen (O$_2$) or a halide gas mixed with a fluorocarbon gas and possibly a diluent gas such as Argon.

Figure 5D:
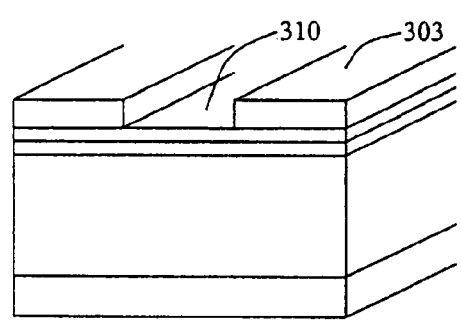

Referring to FIG. 5D, there is shown the photoresist layer being etched according to the process block 265 described above. The photoresist layer 302 is removed to reduce the aspect ratio before etching the illustrative porous low-k dielectric layer. When the first photoresist layer 302 is removed, the result is an IC having the patterned metal hard mask layer 303. After the photoresist 302 has been removed, the etched metal hard mask layer 303 provides the pattern for the etching the first intermediate hard mask layer 304 and the second intermediate hard mask layer 305.

Figure 5E:
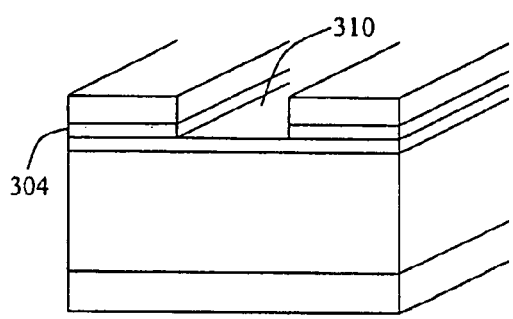
Figure 5F:
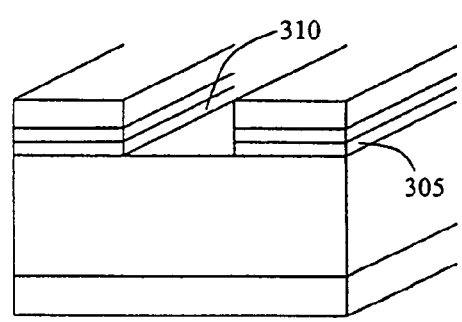

Referring to FIG. 5E there is shown an integrated circuit structure after etching the first intermediate hard mask layer 304. In the illustrative embodiment the first intermediate hard mask layer 304 is etched according to the process step 256. In FIG. 5F there is shown the illustrative integrated circuit structure after etching the second intermediate hard mask layer 305. As previously described in process block 256, during the etching of the second intermediate hard mask there is no oxygen (O$_2$) in the etchant gas mixture.

Referring to FIG. 5G, there is shown the integrated circuit structure after the partial etching of the trench 310 into the porous low-k dielectric layer 306. The partial etching is performed using carbon monoxide and a fluorocarbon gas as described above. The depth of the partial etch is controlled by the amount of time the etchant gas mixture is exposed to the IC structure. Alternatively, the trench may be etched all the way through to porous low-k dielectric material 206 to the barrier layer 208 as shown in FIG. 5G.

Figure 6:
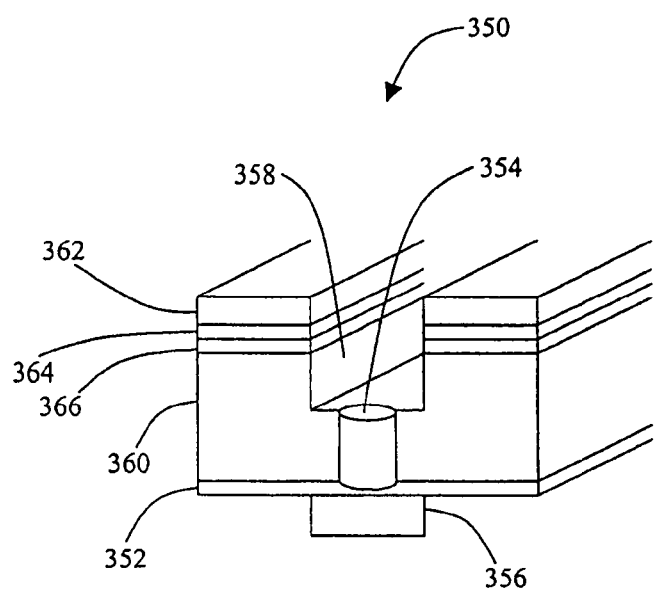
FIG. 6 is isometric view of an etched dual damascene structure.

Referring to FIG. 6 there is shown an etched dual damascene structure 350. The etched dual damascene structure was etched by conducting a via first etch to the barrier layer 352. Underneath the via 354 is an electrically conductive element 356. The via first etch was conducted using the method described in FIG. 2 and FIG. 3 above. A trench 358 is then partially etched into the porous low-k dielectric layer 360 using the method described in FIG. 4 and FIG. 5 above. Although not shown, a photoresist is used to pattern metal hard mask layer 362. The first intermediate hard mask layer 364 and the second intermediate hard mask layer 366 perform the functions of providing adhesion between the dielectric 360 and the metal hard mask layer 362. Additionally, during the etching of the second intermediate hard mask layer there is no oxygen (O$_2$) gas used in the reactor 100. The absence of oxygen in the reactor is needed to ensure that a smooth etch front is generated during the partial etching of the dielectric layer 360.

Although the description above contains many specifications, these should not be construed as limiting the scope of the invention but as merely providing illustrations of some of the presently preferred embodiments of this invention. Thus, the scope of the invention should be determined by the appended claims and their legal equivalents rather than by the illustrative examples given.

What is claimed is:

1. In a plasma processing reactor, a method of etching an integrated circuit (IC) from a substrate, said substrate including a patterned metal hard mask layer, at least one intermediate layer disposed below said patterned hard mask layer, and a dielectric layer disposed below said at least one intermediate layer, comprising:

selectively etching said patterned metal hard mask layer using a first plasma, said first plasma being generated from a first feed gas mixture that contains oxygen (O$_2$);

selectively etching said at least one intermediate layer using a second plasma, said second plasma being generated from a second feed gas mixture that does not contain said oxygen (O$_2$); and selectively etching said dielectric layer using a third plasma, said third plasma being generated from a third feed gas mixture that also does not contain said oxygen (O$_2$), wherein substantially all plasma generated from said oxygen of said first gas mixture is removed from said plasma processing reactor during said selectively etching said at least one intermediate layer and prior to said selectively etching said dielectric layer, and wherein said selectively etching said patterned metal hard mask layer is performed prior to said selectively etching said at least one intermediate layer, and said selectively etching said at least one intermediate layer is performed prior to said selectively etching said dielectric layer, and wherein said selectively etching said patterned metal hard mask layer, said selectively etching said at least one intermediate layer, and said selectively etching said dielectric layer are performed in said plasma processing reactor while said substrate is disposed in said plasma processing reactor.

2. The method of claim 1 wherein said patterned metal hard mask layer comprises Tantalum Nitride (TaN).

3. The method of claim 1 wherein said patterned metal hard mask layer comprises Tantalum.

4. The method of claim 1 wherein said patterned metal hard mask layer comprises Titanium Nitride (TiN).

5. The method of claim 1 wherein said patterned metal hard mask layer comprises Titanium.

6. The method of claim 1 wherein said dielectric layer comprises a silicon-containing compound.

7. The method of claim 1 wherein said dielectric layer comprises a low-k dielectric.

8. The method of claim 1 wherein said dielectric layer comprises a porous low-k dielectric.

9. The method of claim 1 wherein said dielectric layer comprises porous organo-silica-glass (pOSG).

10. The method of claim 1 wherein said third gas mixture further comprises at least one fluorine containing gas.

11. The method of claim 1 wherein said dielectric layer is partially etched and a smooth etch front within said dielectric layer is generated.

12. The method of claim 1 further comprising another intermediate layer disposed between said at least one intermediate layer and said patterned metal hard mask layer, said another intermediate layer being etched using another plasma that is generated from another feed gas mixture, said another feed gas mixture includes oxygen ($O_2$).

13. The method of claim 12 wherein said another intermediate layer includes SiN, said at least one intermediate layer includes SiC.

14. The method of claim 1 wherein said third gas mixture comprising at least one fluorocarbon gas and carbon monoxide (CO) gas.

15. The method of claim 14 wherein said third gas mixture further comprises hydrogen ($H_2$) gas.

16. In a plasma processing reactor, a method of etching an integrated circuit (IC) from a substrate, said substrate including a patterned metal hard mask layer, a first intermediate layer disposed below said patterned hard mask layer, and a silicon-containing dielectric layer disposed below said first intermediate layer, comprising:

selectively etching said patterned metal hard mask layer using a first plasma, said first plasma being generated from a first feed gas mixture that contains oxygen ($O_2$);

selectively etching said first intermediate layer using a second plasma, said second plasma being generated from a second feed gas mixture that does not have oxygen ($O_2$) as a constituent gas; and selectively etching said dielectric layer using a third plasma, said third plasma being generated from a third feed gas mixture that also does not have said oxygen ($O_2$) as a constituent gas, wherein substantially all plasma generated from said oxygen of said first gas mixture is removed from said plasma processing reactor during said selectively etching said first intermediate layer and prior to said selectively etching said dielectric layer, and wherein said selectively etching said patterned metal hard mask layer is performed prior to said selectively etching said first intermediate layer, and said selectively etching said first intermediate layer is performed prior to said selectively etching said dielectric layer, and wherein said selectively etching said patterned metal hard mask layer, said selectively etching said first intermediate layer, and said selectively etching said dielectric layer are performed in said plasma processing reactor while said substrate is disposed in said plasma processing reactor.

17. The method of claim 16 wherein said dielectric layer comprises a low-k dielectric.

18. The method of claim 16 wherein said dielectric layer comprises a porous low-k dielectric.

19. The method of claim 16 wherein said dielectric layer comprises porous organo-silica-glass (pOSG).

20. The method of claim 16 wherein said third gas mixture further comprises at least one fluorine containing gas.

21. The method of claim 16 wherein said third gas mixture comprises hydrogen ($H_2$) gas.

22. The method of claim 16 wherein said dielectric layer is partially etched and a smooth etch front within said dielectric layer is generated.

23. The method of claim 16 wherein said patterned metal hard mask layer comprises Tantalum Nitride (TaN).

24. The method of claim 16 wherein said patterned metal hard mask layer comprises Tantalum.

25. The method of claim 16 wherein said patterned metal hard mask layer comprises Titanium Nitride (TiN).

26. The method of claim 16 wherein said patterned metal hard mask layer comprises titanium.

27. The method of claim 16 wherein said substrate further comprises a second intermediate layer disposed between said patterned metal hard mask layer and said first intermediate layer.

28. The method of claim 16 wherein said first intermediate layer comprises SiC.

29. The method of claim 28 wherein said substrate further comprises a second intermediate layer disposed between said patterned metal hard mask layer and said first intermediate layer.

30. The method of claim 29 wherein said second intermediate layer is etched using a fourth plasma generated from a fourth feed gas mixture that employs said oxygen ($O_2$) as a constituent gas.

31. The method of claim 29 wherein said second intermediate layer comprises SiN.

32. The method of claim 31 wherein said second intermediate layer is etched using a fourth plasma generated from a fourth feed gas mixture that employs said oxygen ($O_2$) as a constituent gas.

33. The method of claim 29 wherein said second intermediate layer comprises SiN.

34. The method of claim 33 wherein said second intermediate layer is etched using a fourth plasma generated from a fourth feed gas mixture that employs said oxygen ($O_2$) as a constituent gas.

* * * * *